United States Patent
Rehm

(10) Patent No.: US 9,748,931 B2
(45) Date of Patent: Aug. 29, 2017

(54) CONTROLLED LARGE SIGNAL CAPACITOR AND INDUCTOR

(71) Applicant: Markus Rehm, Villingen-Schwenningen (DE)

(72) Inventor: Markus Rehm, Villingen-Schwenningen (DE)

( * ) Notice: Subject to any disclaimer, the term of this patent is extended or adjusted under 35 U.S.C. 154(b) by 0 days.

(21) Appl. No.: 15/241,710

(22) Filed: Aug. 19, 2016

(65) Prior Publication Data

US 2016/0373088 A1    Dec. 22, 2016

Related U.S. Application Data

(62) Division of application No. 14/477,418, filed on Sep. 4, 2014, now Pat. No. 9,450,558, which is a division of application No. 13/374,846, filed on Jan. 19, 2012, now Pat. No. 8,854,151.

(30) Foreign Application Priority Data

Jan. 22, 2011    (DE) ..................... 10 2011 009 162

(51) Int. Cl.
  *H03K 3/00*    (2006.01)
  *H03J 5/24*    (2006.01)
  *H04N 3/16*    (2006.01)
  *H04N 3/22*    (2006.01)
  *H04N 3/27*    (2006.01)
  *H03H 7/32*    (2006.01)
  *H03K 3/037*   (2006.01)
  *H03L 7/099*   (2006.01)

(52) U.S. Cl.
  CPC .............. *H03J 5/246* (2013.01); *H03H 7/325* (2013.01); *H03K 3/037* (2013.01); *H04N 3/16* (2013.01); *H04N 3/22* (2013.01); *H04N 3/27* (2013.01); *H03L 7/099* (2013.01)

(58) Field of Classification Search
  CPC ......... H03J 5/246; H03K 3/037; H03H 7/325; H04N 3/16; H04N 3/22; H04N 3/27; H03L 7/099
  USPC ... 331/36 C, 36 L, 117 R, 117 FE, 167, 181; 327/177, 392, 393, 398, 401
  See application file for complete search history.

(56) References Cited

U.S. PATENT DOCUMENTS

| | | |
|---|---|---|
| 4,533,855 A | 8/1985 | Willis et al. |
| 6,426,680 B1 | 7/2002 | Duncan et al. |
| 6,586,895 B2 | 7/2003 | Weber |
| 6,720,838 B2 | 4/2004 | Locke |
| 6,882,236 B2 | 4/2005 | Dinn et al. |
| 8,098,106 B1 | 1/2012 | Sutardja et al. |
| 2004/0183607 A1 | 9/2004 | Moore |
| 2004/0218406 A1 | 11/2004 | Jang et al. |
| 2008/0266007 A1 | 10/2008 | Tsai |
| 2009/0302933 A1 | 12/2009 | Boys et al. |

FOREIGN PATENT DOCUMENTS

| | | |
|---|---|---|
| DE | 195 46 928 A1 | 6/1997 |
| DE | 19723307 A1 | 12/1998 |
| DE | 19925742 A1 | 12/2000 |

*Primary Examiner* — Richard Tan
(74) *Attorney, Agent, or Firm* — Jack Schwartz & Associates, PLLC

(57) ABSTRACT

An electrical resonance network comprising a first capacitor and a first inductor whose resonance frequency can be tuned by means of a second capacitor and/or a second inductor. The resulting effective capacitor- or inductor value of a network period is controlled by a variable coupling respectively decoupling interval by means of at least one coupling switch. The coupling respectively decoupling interval is synchronized by a sign change of a current and/or voltage in the network.

16 Claims, 9 Drawing Sheets

Prior art

Demux state diagram of one resonant circuit period according to Fig. 8:

|  | 0, T6 | T1 | T2 | T3 | T4 | T5 |
|---|---|---|---|---|---|---|
| FF5: | | | | | | |
| Q | 1 | 0 | 0 | 0 | 1 | 1 |
| IQ | 0 | 1 | 1 | 1 | 0 | 0 |
| FF6: | | | | | | |
| Q | 0 | 0 | 1 | 1 | 1 | 0 |
| IQ | 1 | 1 | 0 | 0 | 0 | 1 |
| mit state sensing (Fig. 4): | | | | | | |
| drive Q1a (E') | 1 | 0 | 1 | 1 | 1 | 1 |
| drive Q1b (F') | 1 | 1 | 1 | 1 | 0 | 1 |
| ohne state sensing (Fig 3): | | | | | | |
| drive Q1a (E) | 1 | 0 | 0 | 1 | 1 | 1 |
| drive Q1b (F) | 1 | 1 | 1 | 1 | 0 | 0 |

Fig. 9

Demux state diagram of one resonant circuit period according to Fig. 10:

|  | 0, T6 | T1 | T2 | T3 | T4 | T5 |
|---|---|---|---|---|---|---|
| FF5: | | | | | | |
| Q | 1 | 0 | 0 | 0 | 1 | 1 |
| IQ | 0 | 1 | 1 | 1 | 0 | 0 |
| FF6: | | | | | | |
| Q | 0 | 0 | 1 | 1 | 1 | 0 |
| IQ | 1 | 1 | 0 | 0 | 0 | 1 |
| mit V- sensing (Fig. 6): | | | | | | |
| drive Q1a (E") | 0 | 1 | 1 | 1 | 1 | 0 |
| drive Q1b (F") | 1 | 1 | 0 | 0 | 1 | 1 |
| mit I- sensing in Q1a, Q1b: | | | | | | |
| drive Q1a | 0 | 1 | 0 | 0 | 1 | 0 |
| drive Q1b | 0 | 1 | 0 | 0 | 1 | 0 |

Fig. 11

CONTROLLED LARGE SIGNAL CAPACITOR AND INDUCTOR

FIELD OF THE INVENTION

The present invention relates to tunable inductors or capacitors of the AC power electronics and in particular to switched inductors or capacitors in resonance circuits.

BACKGROUND OF THE INVENTION

Realizing electronically adjustable inductors or capacitors in large-signal applications enables the design of tunable oscillators and filters in various applications, which have no alternatives until now. One is interested in a high efficiency, a stable reliable operation and in low implementation cost in such applications. The design of switched circuit concepts, that fulfill all these requirements and remain operational far into the high frequency range, is a real challenge. First, the basic physical network conditions shall be met. In addition, it is important to consider component properties, which influence the network characteristics significantly. Controlled reactances based on switched capacitors or switched inductors have low losses and are used in CRT horizontal deflection. U.S. Pat. No. 4,533,855 shows how to control the resulting total capacitance of two coupled capacitors by varying the coupling interval during a period of a resonant circuit electronically. FIG. 1 shows the main circuit wherein the capacitor CS and the inductance LH form a series resonant circuit. The capacitor CM is coupled by a controlled switch transistor Q1 and a diode D1 to capacitor CS in a part interval of the resonant circuit period. The coupling control is operative during one half period of the resonant circuit, because during the other half period D1 is always conductive. The capacitor CR is not relevant because it is short-circuited by the transistor QH and diode DH. The transformer DR develops at its secondary winding a voltage pulse during the retrace interval, which depends only on the control signal from QH. This results in a pulse-width modulation signal (in the following named as PWM signal) at the control input of Q1, which is directly coupled to the control signal QH (h drive). When the PWM signal at the input (mod) is changed, the PWM interval length varies but not its phase angle with respect to h-drive.

U.S. Pat. No. 6,586,895 shows how to control an inductor or a higher order network using a variable coupling interval during both half waves of a resonant circuit period. FIG. 2 shows the main circuit wherein the capacitor CS and the inductance LH form a series resonant circuit. The capacitor CM and the inductor LM are both coupled via the controlled transistors Q1a and Q1b and their integrated body diodes to CS in two part-intervals of the resonance circuit period. The coupling control operates in both half cycles of the resonant circuit period, since the current in CM and LM depends in both directions from the control of the transistors Q1a respectively Q1b. The capacitor CR is not relevant, because it remains short-circuited by the transistor QH and diode DH, or the transistors Q1a and Q1b remain fully open or fully closed when QH is open.

In the approaches mentioned above a PWM signal is generated, which is synchronized with the deflection frequency. This is done by means of a sawtooth generator, which is directly connected to the input signal h-drive or alternatively synchronized over the horizontal retrace pulse. In all of these solutions the PWM signal remains unaffected from the controlled capacitance or inductance and the resulting resonance circuit period. The PWM modulator is therefore only controlled by the deflection frequency (h-drive) and the input (mod). If one wants to tune the resonance frequency in an LC resonant circuit by means of a controlled coupling interval of capacities or inductances characterized by resulting substantially equal half-periods, the coupling interval must remain in phase with the resonance circuit period, or at least remain in phase with the corresponding half-period. A coupling control signal, which is independent from the resonant circuit period can no longer be used to generate the switching signals for the transistors.

The generation of control signals, which shall be dependent on the controlled signal itself is very difficult. The main problem is that altering the output signal instantly changes the input value and can thus make the system unstable. In this case, the frequency change in the resonant circuit has a direct influence on the coupling control. An integration or low-pass filtering of the control variables for the sawtooth generator can minimize this positive feedback behavior and stabilize such systems. The eminent disadvantage of this method is a poorer dynamic behavior with respect to the control input. The system transient response becomes slower with respect to the control input. The capacitance and inductance can be varied only as fast as the control signals can be updated. It is desired that frequency tuning of tunable resonant circuits or filters is only dependent on one single input control variable. This means that amplitude variations in current or voltage shall not affect the frequency. In other applications the amplitude in a resonant circuit shall be controlled or regulated independently from the resonant circuit frequency.

Therefore, in a tunable resonant circuit using controlled interval coupling for its component variation, it is therefore very important that the PWM signal can be controlled independently from the current- or voltage amplitude in the resonant circuit. This means the resulting resonance frequency is a function of a control variable only. Capacitance or inductance using controlled interval coupling in resonant circuits or generally many other inductor and capacitor circuits often generate a current flow through diodes, which represent often the integrated body diodes of switches. The conduction loss of the diodes is proportional to the diode threshold voltage and current. Since these resonant circuits are often one of a zero voltage switching (ZVS) or zero current switching (ZCS) concept, the losses are mainly determined by the switch and the diode conduction losses. Furthermore, the diodes generate transients in the transition interval from blocking to conduction mode and vice versa, interferences and therefore additional losses. Therefore, in efficient circuit design concepts it is therefore important that all these factors can be avoided or at least be minimized. The following invention describes a method and their detailed implementations to control capacities or inductances electronically. It fulfills all the requirements above and is characterized by the fastest possible transient response regarding the control behavior. A capacitance or inductance can be varied in its entire dynamic range from one resonance circuit half period to the other one.

SUMMARY OF THE INVENTION

In a first aspect of the invention, a capacitance or inductance is coupled by a controlled switch to a resonant circuit. The coupling interval comprises a part interval of one period, which is determined by the resulting network. A current or voltage zero crossing detector generates a trigger signal, which generates a pulse width modulation signal. The pulse width is controlled by an electronic control variable. The state of the switch is defined by the pulse width signal. In a further aspect of the invention, the coupling control signal of the switch is modified, such that the diode current flow interval is bridged or at least substantially reduced by additional activation of the controlled switch.

SHORT DESCRIPTIONS OF DRAWINGS

FIG. 9 shows a state diagram of the switches according to the circuit in FIG. 8.

FIG. 11 shows a state diagram of the switches according to the circuit in FIG. 10.

DETAILED DESCRIPTION OF THE INVENTION

Figure 1:
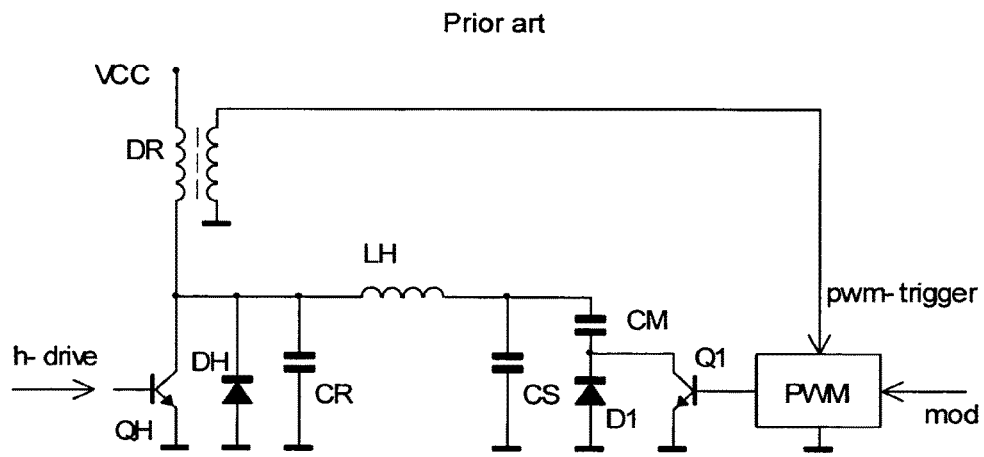
FIG. 1 shows a circuit to control the value of a capacitor in a resonance circuit according to a first prior art.
Figure 2:
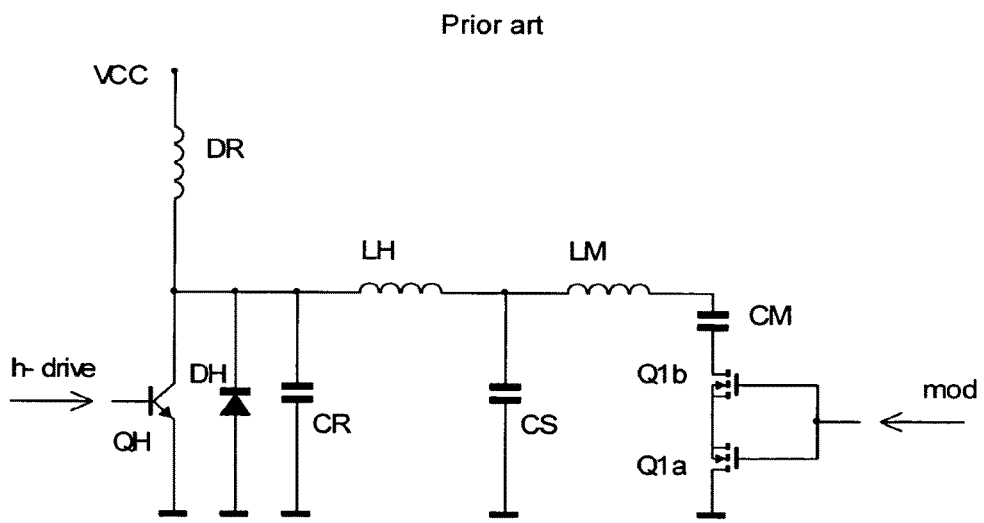
FIG. 2 shows a circuit to control the value of an inductor in a resonance circuit according to a second prior art.
Figures 3, 4:
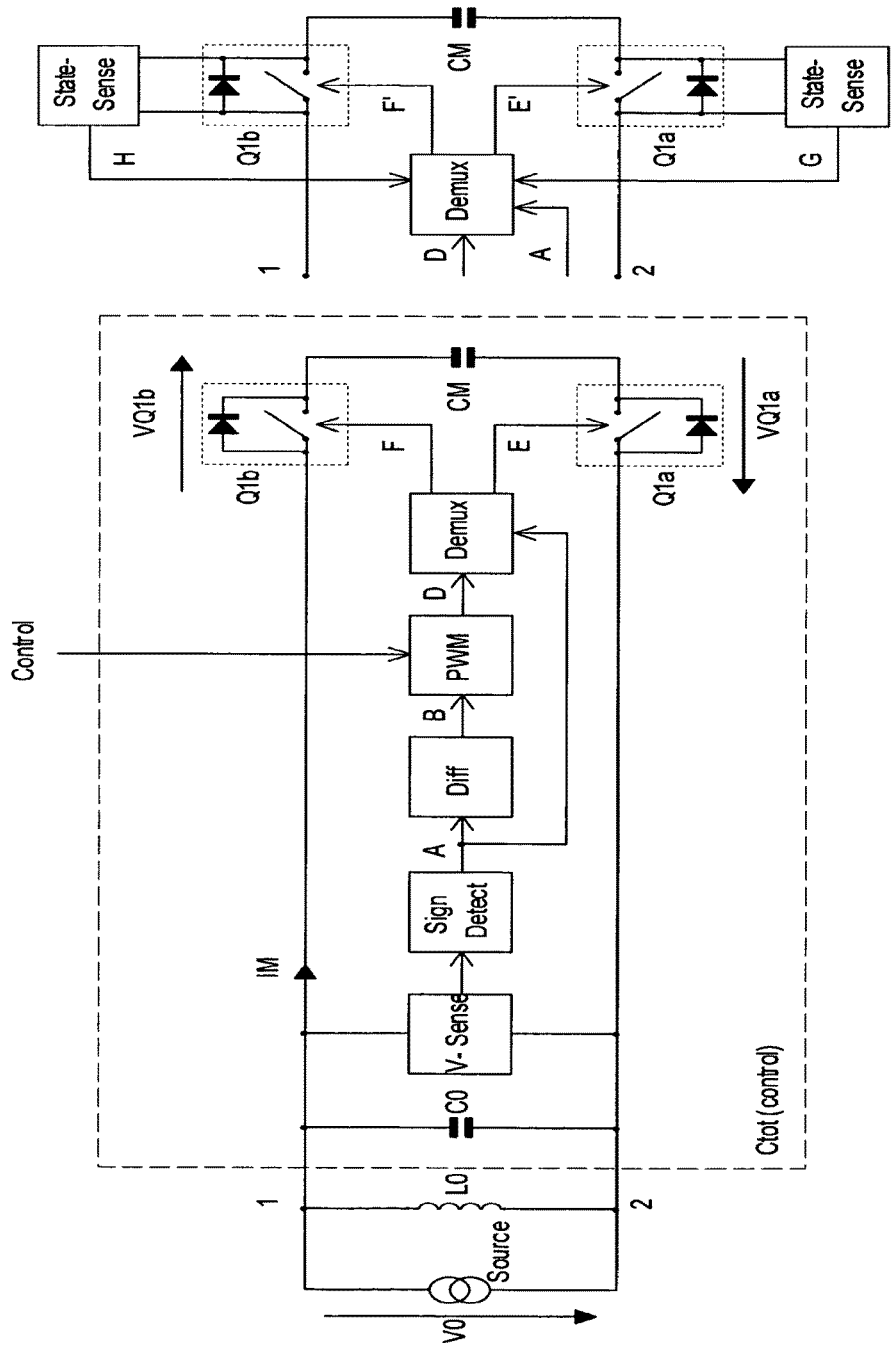
FIG. 3 shows the block diagram to control the value of a capacitor in a resonance circuit according to the invention.
FIG. 4 shows the block diagram with an expansion to FIG. 3.
Figure 5:
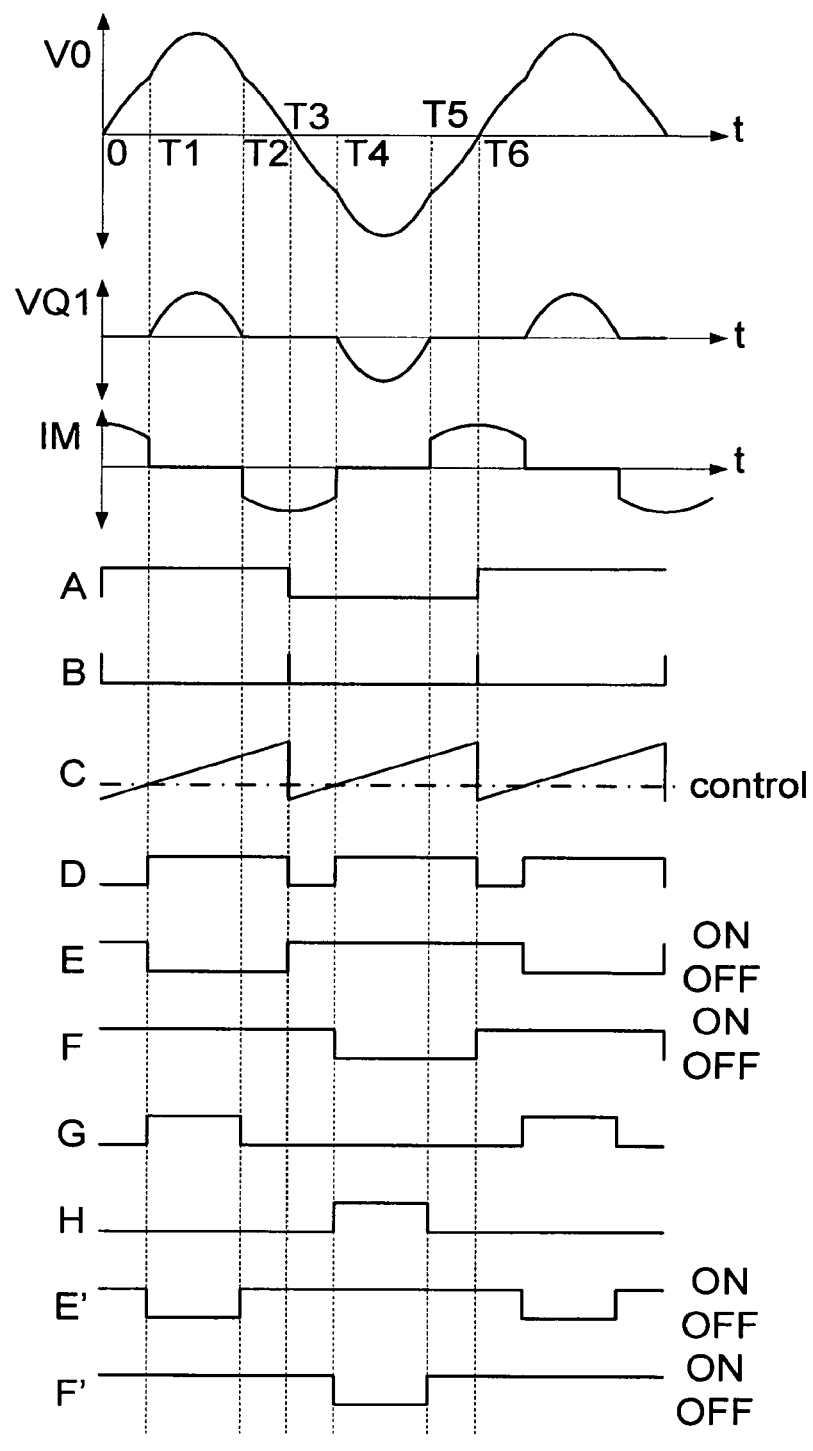
FIG. 5 shows waveforms according to FIGS. 3 and 4.

FIG. 3 shows the block diagram of a resonant network, whose total capacity is varied by an electrical input value. Signal waveforms of FIG. 3 are shown in FIG. 5 and are used in the further description with its indices. The energy source (source) is connected to the nodes 1 and 2 with a parallel resonant circuit. The energy source can be any AC power source or any part of a LC-coupled supply network (not shown). The inductor L0 and capacitor C0 form a resonant circuit. The capacitor CM is coupled to C0 via coupling switches Q1a and Q1b. The plotted diodes indicate that the coupling switches are controlled in only one direction. In the opposite current direction Q1a and Q1b remain bridged by the diodes. In the further description, the term switch defines the functional active controllable part of Q1a and Q1b. The term coupling switch defines the functional active controllable part and the diode. The first limiting conditions of the switch control is the one when the coupling switches Q1a and Q1b are always open. Then, the resulting total capacity is equal to C0 and therefore minimal. Consequently, the resonance frequency is maximal. The second limiting conditions of the switch control is the one when the coupling switches Q1a and Q1b are always closed. Then the resulting total capacity is equal to the parallel circuit of C0 and CM and therefore maximal. Consequently, the resonance frequency is minimal. For part interval coupling of CM with C0 any desired intermediate value between the two extreme values can be set for total capacity by the control input Control. Part interval coupling of C0 and CM means a coupling interval defined by a portion of the resulting resonant circuit period. This represents a time- or angle interval in the following description. The whole circuit represents a total capacity (Ctot), whose value is controlled by Control. The resonance circuit frequency equals the average of the entire resonance circuit period. The actual resonance circuit frequency changes within the resonant circuit period between minimum and maximum respectively maximum and minimum based on the states of the two coupling switches. The resulting capacitor voltage V0 is sensed in block V-Sense and coupled to block Sign Detect for sign determination. The capacitor voltage sensing can comprise a voltage tapping, thereby it is only important that the sign of the output signal has a defined phase relationship to the voltage V0 across the capacitor C0. The resulting waveform is shown in A. The following differentiator (Diff) derives A after the time and outputs its absolute value, as shown in trace B. This results in positive pulses at each zero crossing instants 0, T3 and T6 of the resonant circuit voltage V0. The pulse width modulator (PWM) generates a sawtooth C (not shown in FIG. 3, since it is a signal inside the PWM modulator), which runs synchronously with the pulses B. This sawtooth trace C is compared versus the control value Control inside the PWM block. Is Control lower than C, the PWM output D is high. Is Control greater than C, the PWM output D is low. Based on the known pulse width modulation (PWM) principle the PWM-modulator can be realized in various ways. It is only essential that the PWM signal D is triggered by B and the pulse width is controlled by the input Control. The subsequent Demux block uses signal A to selects a portion according to the corresponding half-wave and couples it to the switches Q1a and Q1b. Is A high, the negated signal D controls the switch Q1a via E. Is A low, the negated signal D controls the switch Q1b via F. Is D not linked by A with the output E respectively F, the corresponding output E respectively F remains high. The switch Q1a respectively Q1b is closed (ON) if E respectively F is high. If E respectively F is low, Q1a respectively Q1b is open.

A further possible variant to generate the signals for the switches is to trigger a frequency divider by the positive edges of D and use of its output respectively negated output directly to control the switches Q1a and Q1b (not shown). The advantage of the described logical linking with A is that the switches remain longer closed. This increases the current flow interval in the switches by the additional interval from T3 to T4 in the switch Q1a respectively by the additional interval from 0 to T1 in the switch Q1b. This keeps the switches always at least a half cycle closed and let them bypass their internal diodes. This results in lower conduction losses and prevents the formation of turn-on transients in the diodes, whereby may still flow a current in the diodes. This process reduces in any case losses, especially if the resistance of the switches (Rdson) is sufficiently small. When E becomes low, the coupling switch Q1a opens and it develops a positive half sinusoidal voltage wave in the sum of VQ1=VQ1a+VQ1b during the time interval from T1 to T2. During this interval, no current flows through CM. When the voltage VQ1 becomes zero (time instant T2), the stored energy in L0 generates a negative current flow through the internal diode of the coupling switch Q1a. This lasts from T2 to T3 and is replaced by the above described process of conducting (or inverse conducting) switch Q1a. The coupling switches Q1a and Q1b remain closed until the signal F goes low. It develops a negative half sinusoidal voltage wave in the sum of VQ1 during the time interval from T4 to T5. During this interval, no current flows through CM. When the voltage VQ1 becomes zero (time instant T5), the stored energy in L0 generates a negative current flow through the internal diode of the coupling switch Q1b. This lasts from T5 to T6, and is replaced by the above described process of conducting (or inverse conducting) switch Q1b.

The entire current flow interval of the internal diodes is reduced to the interval from T2 to T3 and T5 to T6.

A further minimization of the losses can be achieved when the switch Q1a respectively Q1b always remain closed, except during the interval from T1 to T2 respectively T4 to T5. This is indicated in FIG. 4, the state of the coupling is detected by the block State-Sense. This can be implemented by a current sensor (not shown) or, as shown in FIG. 4 by a switch voltage measurement. The output G respectively H is then further linked with D and A in the Demux block to generate the drive signals E' and F'. D and A define the transition from high (ON) to low (OFF) see time instant T1 in E' respectively T4 in F'. The transition from low (OFF) to high (ON) is controlled by G respectively H with the falling edge, see time instant T2 in E' respectively T5 in F'. This method serves the highest efficiency, because the diodes remain bridged in their entire current flow interval.

Figure 6:
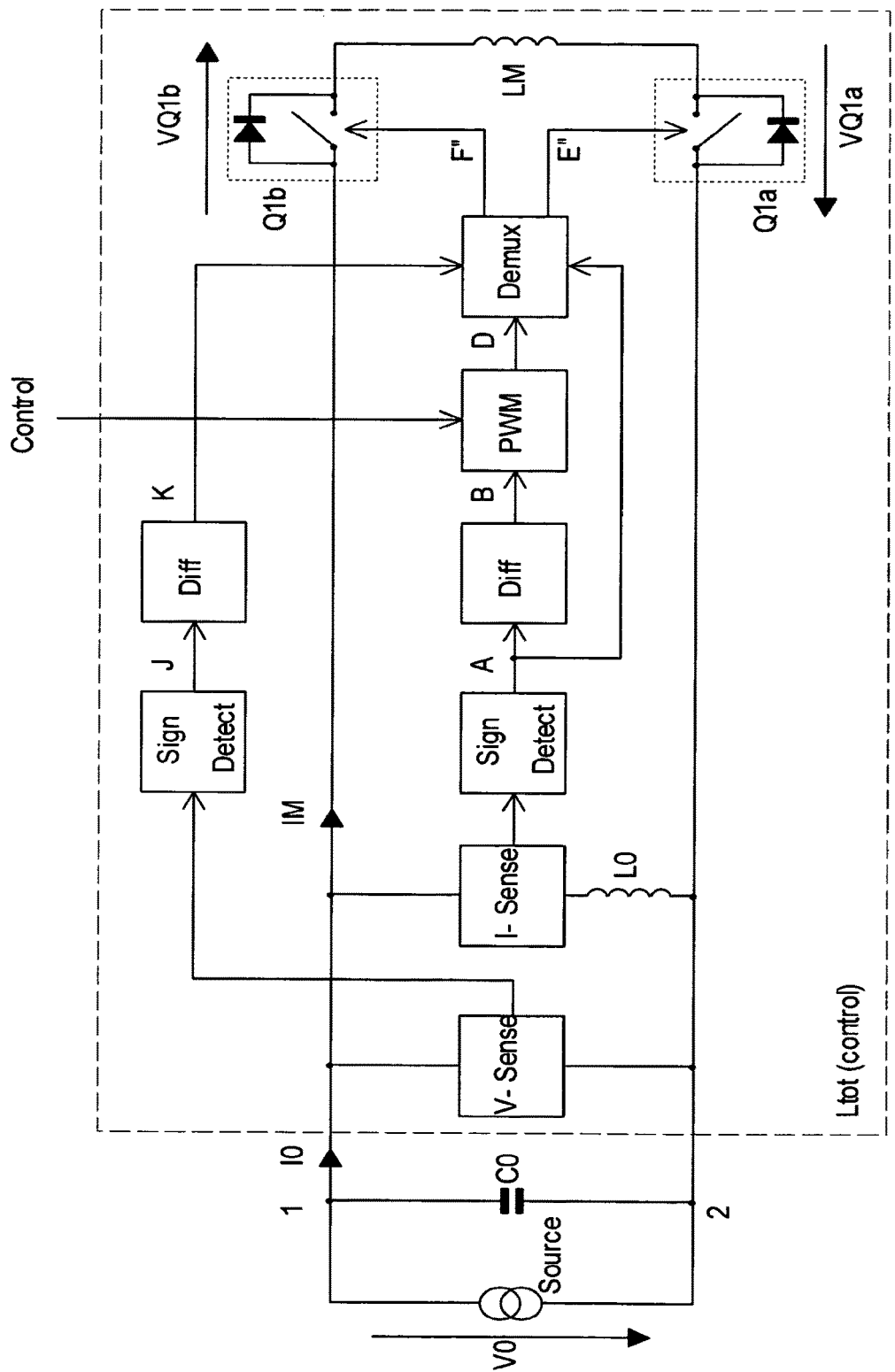
FIG. 6 shows the block diagram to control the value of an inductor in a resonance circuit according to the invention.
Figure 7:
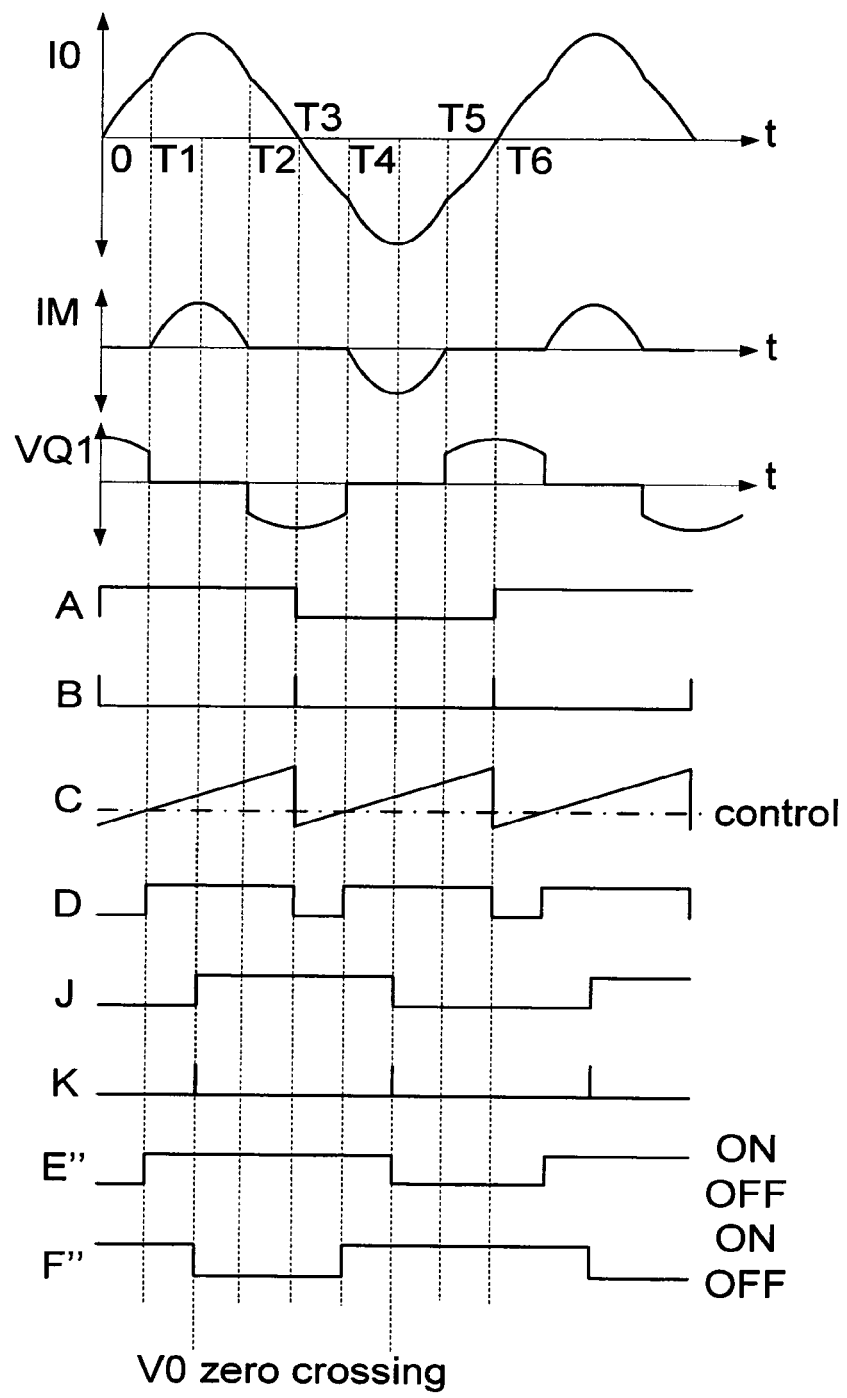
FIG. 7 shows waveforms according to FIG. 6.

FIG. 6 shows the block diagram of a resonant network, whose total inductance is varied by an electrical input value. Signal waveforms of FIG. 6 are shown in FIG. 7 and are used in the further description of its indices. The energy source (Source) is connected to the nodes 1 and 2 with a parallel resonant circuit. The energy source can be any AC power source or any part of a LC-coupled supply network (not shown).

The inductor L0 and capacitor C0 form a resonant circuit. The inductor LM is coupled to L0 via coupling switches Q1a and Q1b. The first limiting conditions of the switch control is given when the coupling switches Q1a and Q1b are always open. Then, the resulting total inductivity is equal to L0 and therefore maximal. Consequently, the resonance frequency is minimal. The second limiting conditions of the switch control is the one when the coupling switches Q1a and Q1b are always closed. Then the resulting total inductivity is equal to the parallel circuit of L0 and LM and therefore minimal. Consequently, the resonance frequency is maximal. For part interval coupling of LM with L0, any desired intermediate value between the two extreme values can be set for the total inductivity by the control input Control. The resonance circuit frequency is obtained as the average of the entire resonance circuit period.

The actual resonance circuit frequency changes within the resonant circuit period between minimum and maximum respectively maximum and minimum based on the states of the two coupling switches. The resulting inductor current is sensed in block I-Sense and coupled to block Sign Detect for sign determination. The inductor current sensing can comprise a current tapping. It is only important that the sign of the output signal has a defined phase relationship to the current I0 of the inductor L0. The resulting waveform is shown in A. The following differentiator (Diff) derives A after the time and outputs its absolute value, see trace B. This results in positive pulses for each zero crossing instants 0, T3 and T6 of the resonant circuit current I0. The pulse width modulator (PWM) generates a sawtooth C (not shown in FIG. 6, since it is a signal inside the PWM modulator), which is synchronous with the pulses B. This sawtooth trace C is compared versus the control value Control inside the PWM block. Is Control lower than C, the PWM output D is high. Is Control greater than C, the PWM output D is low. Based on the known pulse width modulation (PWM) principle the PWM-modulator can be realized in various ways. It is only essential that the PWM signal D is triggered by B and the pulse width is controlled by the input Control. The voltage across the L0 is sensed in block V-Sense and the following block Sign Detect determines its sign, see signal J. The following differentiator (Diff) derives J after the time and outputs its absolute value, see curve K. This results in positive pulses for each zero crossing of the resonant circuit voltage V0 (see V0 zero crossing in FIG. 7). The timing of the signal pulses K coincide with the maxima and minima of the current I0. The signal C is associated with A and D in Demux to generate the drive signals E'' and F'' for the switches Q1a and Q1b. The switch Q1a respectively Q1b is closed (ON), if E'' respectively F''' is high. If E'' respectively F is low, then Q1a respectively Q1b is open. Is A high, the signal D controls via E'' the closing of switch Q1a (see time instant T1). Is A low, the signal D controls via F''' the closing of switch Q1b see (time instant T4). The transition from high (ON) to low (OFF) in E'' and F is controlled by signal K in conjunction with signal A, see time points V0 zero crossing in E'' and F. Signal A selects the switch being controlled. Is A low, the switch Q1a opens via E'' with K. Is A high, the switch Q1b opens via F''' with K. The ON to OFF transition control of the switches by using K, halves the diode current flow interval comparing to control signals that are generated only by A and D (not shown in FIG. 7). The reduced diode current flow interval results in smaller losses and prevents the formation of turn on transients in the diodes. There may still flow a current in the diodes. This process reduces in any case losses, especially if the resistance of the switches (Rdson) is sufficiently small. When E'' becomes high, the coupling switch Q1a closes and it develops a half sinusoidal current wave in IM. During this interval, the total coupling switch voltage VQ1=VQ1a+VQ1b is zero, because both coupling switches are closed. If the current IM becomes zero at time instant T2, the stored energy in C0 generates a negative voltage step in the internal diode of Q1b and consequently the current flow interrupts. When F''' becomes high, the coupling switch Q1b closes and it develops a negative half sinusoidal current wave in IM during the time interval from T4 to T5. During this interval, the total coupling switch voltage VQ1 is zero, because both coupling switches are closed. If the current IM becomes zero at time instant T5, the stored energy in C0 generates a negative voltage step in the internal diode of Q1b and consequently the current flow interrupts. The current flow interval of the internal diode is limited to the interval from V0 zero crossing to T2 of the positive half wave of IM respectively T5 in the negative half wave of IM.

Valid for all methods of FIGS. 3, 4 and 6 is the independence of the switch signals E, E', E'', F, F' and F''' to amplitude changes of the resonant circuit voltage and the resonant circuit current. It is easy to see that the switch signal generation is coupled only during a short event with the resonant circuit. This corresponds to a differentiation of a sign change of voltage respectively current in the network. In the described circuit this concept is implemented with the edge triggering. Consequently, any change in the resonant circuit, which does not coincide in time with the trigger event has no effect on the control signals of switches Q1a and Q1b. Thus, the coupling control interval is only dependent on the control input Control.

It is also easy to recognize that one can update the control value (Control) from one resonant circuit half cycle (from 0 to T3) to the next (from T3 to T6 respectively 0). Consequently, the shortest possible time response respectively the greatest possible transmission bandwidth is reached with respect to the control input (control).

The coupling switch control corresponds in the FIGS. 3, 4 and 6 to a delayed turn ON or a delayed turn OFF. The delay is determined by a control variable (Control).

All functional blocks in the FIGS. 3, 4 and 6 have signal delays between input and output signal. These signal delays limit the earliest possible beginning of the decoupling interval (T1, T4 in the FIGS. 5 and 7). This limits the control range in the FIGS. 3, 4 and 5 because in the first limiting conditions of the switch control the switches Q1a and Q1b shall immediately be in open state at the zero crossing of the voltage V0. Equivalent, the control range is limited in FIGS. 6 and 7 because in the first limiting conditions of the switch control the switches Q1a and Q1b shall immediately be in closed state at the zero crossing of the current I0. To compensate this, one or more blocks in FIGS. 3, 4 and 6 are characterized with a phase advance in their transfer function. This allows to compensate signal delays and the entire control range can be used. This means, for example, the sawtooth signal would sooner trigger than as shown in FIGS. 5 and 7. Then, the intersection with the signal Control appears before the actual zero crossing of the resonant circuit voltage respectively resonant circuit current. In this way, the switches can be set to the states, they need to have at the corresponding zero crossing at full scale control range. For this case are 0 and T1 respectively T4 and T3 identical. The result is a continuous smooth transition between the two voltages half-waves (VQ1 in FIG. 5) respectively current half-waves (IM in FIG. 7). It can be required to replace the V-Sense block by a I-Sense block, and vice versa in FIGS. 3, 4 and 6 (not shown). In addition, some of the signals A, G, H and J can be used inverted. In this way one can obtain also higher amounts of phase advance values. These possibilities may be required, especially if the discussed concepts are used at higher frequencies, wherein the overall signal delay is about or greater than 90 degrees of a network period.

Further, the required amount of phase advance may provide almost optimal switching signals E' and F' (FIG. 4) respectively E' and F"(FIG. 6), then the State-Sense blocks in FIG. 4, respectively the additional V-Sense block in FIG. 6 are no longer required. This may require an update in the Demux logic depending on the required output signals. For example, instead of signal A, the inverse signal A can be used in Demux (not shown) Implementing these options may become relevant depending on the used logic and switch characteristics, desired network resonance frequency and the desired tuning range.

From network theory it is known that any parallel circuits can be converted in series circuits and vice versa. Additionally, the components can also be permuted arbitrarily in these circuits. It is clear, that the described concepts in FIGS. 3, 4 and 6 can directly be applied to a series circuit of the components C0, Cm, L0 respectively L0, LM, C0. Furthermore, the coupling circuit can consist generally of one or two capacities (CM) or inductors (LM). It is also clear that the presented concepts can also be applied to asymmetric network periods respectively to only one coupling switch.

Figure 8:
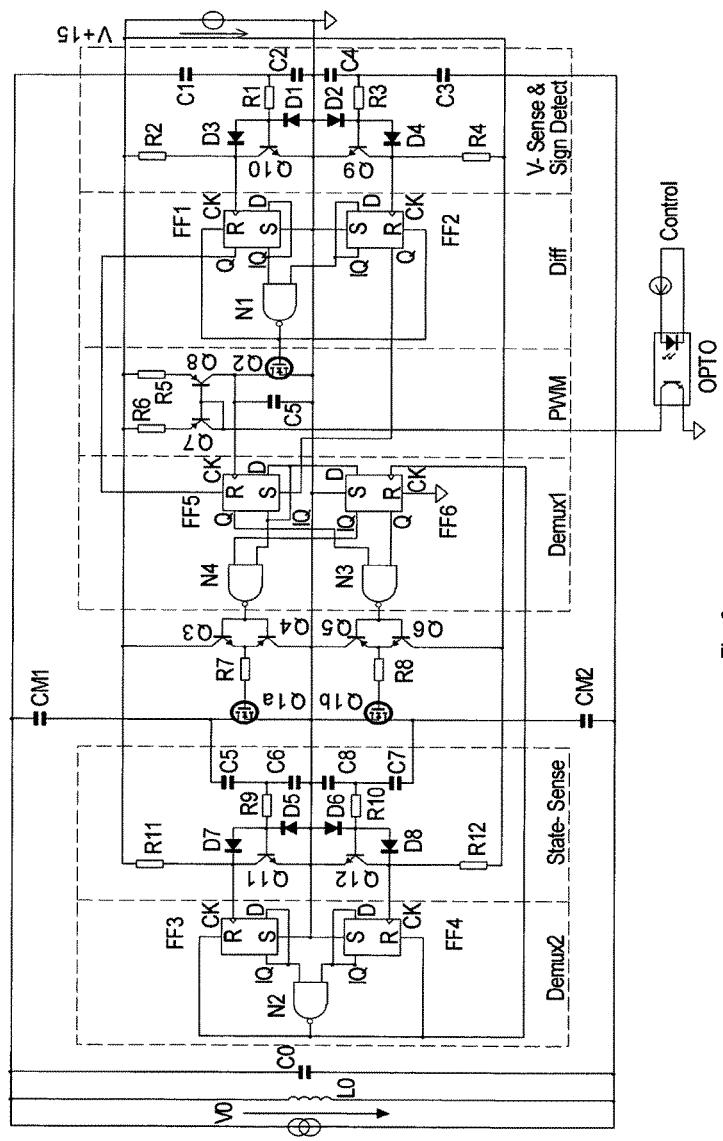
FIG. 8 shows a detailed circuit diagram to control the value of a capacitor in a resonance circuit according to the invention.

FIG. 8 shows a detailed circuit according to FIG. 4. The dashed lines include parts of the block diagram. In the further description waveforms of FIG. 5 are referenced with their indices. CM is designed as a series connection of two capacitors CM1 and CM2, which is coupled to Q1a and Q1b to C0. The switch control circuit operates at a supply voltage V+15. An opto coupler transmits the control information (Control) isolated, because the switch control circuit operating on V+15, shall be electrically isolated from the rest of the network. The capacitors C1 and C2 sense the positive voltage half-wave of V0 and couple it via R1 to the base of transistor Q10. Q10 acts as a quasi-zero-voltage detector of the positive half wave. D1 and D3 accelerate the turn off in Q10 as soon as the voltage across C2 falls below the threshold voltage of Q10. The capacitive voltage divider C1, C2 prevents DC coupling with V0. In addition, the components R1, C1 and C2 may provide a phase advance. To this end, these components are so dimensioned that the phase advance value is at least as large as the entire signal delay of the entire control circuit. This allows the use of the entire control range of the circuit. The components of Q9, D2, D4, R3, R4, C3 and C4 operate identically to the components of Q10, being responsible for the negative half wave of V0. The two D flip-flop FF1, FF2 and the NAND gate N1 detect the two positive edges of the output signals of the zero-voltage detectors Q9 and Q10. This sets alternately the output Q of a flip-flop (FF1 respectively FF2) to high, once it is triggered on the clock CK. This state is immediately reverted by the corresponding reset input after the propagation time of N1. This results in voltage pulses at the output of N1 at each zero crossing of V0 (waveform B) consequently, this closes Q2 completely during the representative short time interval. This symmetrical implementation guarantees identical behavior with respect to the two voltage half-waves of V0. In addition, Q2 is coupled with the voltage V0 only during the brief moment of the trigger event. Q7, Q8, R6 and R5 mirror a control current, defined by the control variable Control, which flows into the capacitor C5. The result is a sawtooth voltage on C5 (curve C), whose timing of its lowest level fall together with the control pulses of Q2. This sawtooth triggers FF5 via the input CK as soon as its switching threshold is reached. This time can be controlled via the control input Control, because the slope of the sawtooth voltage changes by the collector current in Q8 and thus varies with Control. FF5, FF6, N3 and N4 form the first part of the Demux. FF5 is configured with pulses on the Set (S) respectively Reset (R) inputs that the sawtooth always becomes responsible for the corresponding switch, which is responsible for the corresponding half-wave. That represents a switching signal selection by signal A. Appears V0 with the its positive half wave, D2 is conducting. The collector of Q9 is high and triggers FF2 on CK. The short appearing high pulse on output Q of FF2 set the output Q of FF5 via its set (S) input. The low at output IQ of FF5 forces a high on the output of N4, which closes Q1a by the drivers Q3, Q4. This is the initial condition for the controlled decoupling of CM1 and CM2 during the positive half wave of V0. If the switching threshold of the PWM modulator is reached (the voltage across C5 is equal to the threshold of FF5), FF5 toggles: Q is low and IQ is high. IQ of FF6 is also high, thus the output of N4 switches to low, consequently the coupling switch Q1a is opened by the drivers Q3, Q4. A similar situation happens during the negative half wave of V0. FF5 is reset via the R input by FF1 when D1 is conducting and FF1 triggers on the clock CK. This forces a high at the output of N3, which closes Q1b by the drivers Q5, Q6. This is the initial condition for the controlled decoupling of CM1 and CM2 during the negative half wave of V0. If the switching threshold of the PWM modulator is reached (the voltage across C5 is equal to the threshold of FF5), FF5 toggles: Q is high and IQ is low. Q of FF6 is also high, thus the output of N3 switches to low, consequently the coupling switch Q1b is opened by the drivers Q5, Q6. The closing of the switches is controlled by Demux2. For this, the states of the two coupling switches Q1a and Q1b are detected by a voltage sensor. The capacitors C5 and C6 sense the positive voltage half-wave of VQ1. In this way the state of Q1a is detected and used to control the base of Q11 by R9. Q11 acts as a quasi-zero-voltage detector. D5 and D7 accelerate the turn off Q11 as soon as the voltage across C6 falls below the threshold voltage of Q11. The capacitive voltage divider C5, C6 prevents DC coupling with V0. Additionally, this integrating voltage detection makes the voltage sensing insensitive to current transients in the current mesh Q1a. The components of Q12, D6, D8, R10, R12, C7 and C8 operate identically to the components to Q11. They are responsible for the negative half wave of VQ1 and hence detect the state of Q1b. The two D flip-flops FF3, FF4 and the NAND gate N2 detect the two positive edge changes of the zero-voltage detectors Q11 and Q12. This triggers the corresponding flip-flop as soon as it is triggered at the Clock CK input. This state is reverted immediately by the corresponding reset input after the propagation time of N2. This results in voltage pulses at the output of N2 when the voltage across Q1a respectively Q1b becomes zero. This signals the moment to close the corresponding switch again to enable bridging the integrated diode. This "turn-on command" triggers FF6 on the Clock input. Consequently the outputs of FF6 become equal to those of FF5. This forces N3 respectively N4, which was previously at a low output low level to a high output level. This ensures that from this point in time both switches Q1a and Q1b remain closed until the end of the corresponding half-wave of V0. The advantage of this differentiation (edge detection using flip-flops) is the resilience to transients, which affect only the function disruptively when the total voltage changes its sign. This makes the "turn-on command" of the switches Q1a and Q1b insensitive to network transients.

After the circuit start-up, the flip-flop FF6 resynchronizes itself after a maximum time interval during one resonant circuit period. Then, always at least one of the coupling switches Q1a respectively Q1b has been opened and a clock pulse is generated for FF6

FIG. 9 shows a summary of the Demux signal states over a resonant circuit period, the states are shown after the clock (CK) trigger event of the corresponding flip-flops. The output signals of the state diagram correspond to the signals E, E' respectively F and F' of FIG. 5. A significant simplification of the circuit is based on the approach of FIG. 3. There the blocks State-Sense and Demux2 are eliminated. Therefore, the output of the NAND N1 is directly connected to the clock input (CK) of FF6. The output signals from FF5 and Demux are also shown in FIG. 9.

The simplest control circuit is obtained when the switches are controlled by a simple frequency division by means of FF5. In this case the blocks FF6, N3, N4, State-Sense and Demux2 are eliminated. The Q output of FF5 is connected directly to the input of driver Q3 and Q4. The output IQ of FF5 is directly connected to the input of drivers Q5 and Q6. This variant, however, has the lowest efficiency.

Figure 10:
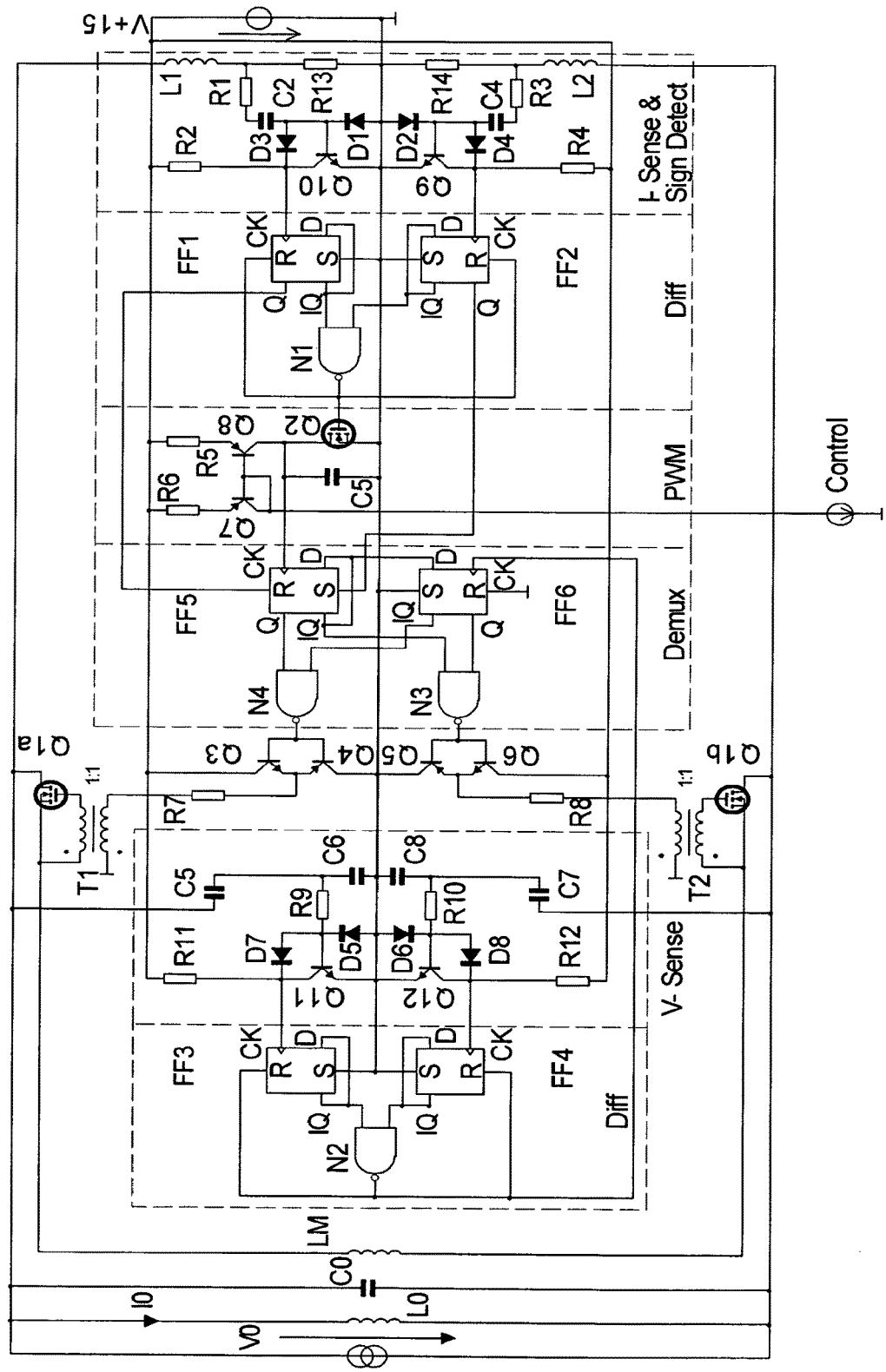
FIG. 10 shows a detailed circuit diagram to control the value of an inductor in a resonance circuit according to the invention.

FIG. 10 shows a detailed circuit according to FIG. 6. The dashed lines include parts of the block diagram. In the further description waveforms of FIG. 7 are referenced with their indices. LM is coupled to L0 via Q1a and Q1b. The switch control circuit operates at a supply voltage V+15 with arbitrary reference potential. The required control signals for the coupling switches Q1a Q1b are coupled isolated via the transformer T1 respectively T2 to Q1a respectively Q1b. Alternatively, an optocoupler is used with subsequent driver (not shown). With the use of an opto-coupler instead of T1 respectively T2, the driver stages Q3 . . . Q6 are omitted. The advantage of a single inductance LM is the greater efficiency and lower costs. In addition, the control current (Control) is now supplied directly without isolation. The inductor L1 sense the positive current half-wave of I0 and couples it by means of the shunt resistor R13 via R1 and C2 to the base of transistor Q10. Q10 acts as a quasi zero-current detector of the positive half-wave. D1 and D3 accelerate the turn off in Q10 as soon as the current in C2 changes its sign. The capacitor C2 prevents DC coupling with I0. In addition, the components L1, R1, R13 and C2 may provide a phase advance. To this end, these components are so dimensioned that the phase advance value is at least as large as the entire signal delay of the control circuit. This allows the use of the entire control range of the circuit. The components of Q9, D2, D4, R3, R4, R14, C4 and L2 operate identically to the components of Q10, here, they are responsible for the negative half wave of V0. The two D flip-flop FF1, FF2 and the NAND gate N1 detected the two positive edges of the output signals of the zero-current detectors Q9 and Q10. This sets alternately the output Q of a flip-flop (FF1 respectively FF2) to high, once it is triggered on the clock CK. This state is immediately reverted by the corresponding reset input after the propagation time of N1. This results in voltage pulses at the output of N1 at each zero crossing of I0 (waveform B), this closes Q2 completely for the representative short time interval. This symmetrical implementation guarantees identical behavior with respect to the two current half-waves of I0. In addition, Q2 is coupled with the current I0 only during the brief moment of the trigger event. Q7, Q8, R6 and R5 mirror a control current, defined by the control variable Control, which flows into the capacitor C5. The result is a sawtooth voltage on C5 (curve C), whose timing of its lowest level fall together with the control pulses of Q2. This sawtooth triggers FF5 via the input. CK as soon as its switching threshold is reached. This time can be controlled via the control input Control, because the slope of the sawtooth voltage changes by the collector current in Q8 and thus varies with Control. FF5, FF6, N3 and N4 form the first part of the Demux. FF5 is configured with pulses on the Set (S) respectively Reset (R) inputs that the sawtooth always becomes responsible for the corresponding switch, which is responsible for the corresponding half-wave. That represents a switching signal selection by signal A. Appears I0 with the its positive half wave, D2 is conducting. The collector of Q9 is high and triggers FF2 on CK. The short appearing high pulse on output Q of FF2 set the output Q of FF5 via its set (S) input. The high at output Q of FF5 forces a low on the output of N4, which opens Q1a by the drivers Q3, Q4. This is the initial condition for the controlled coupling of LM during the positive half wave of I0. If the switching threshold of the PWM modulator is reached (the voltage across C5 is equal to the threshold of FF5), FF5 toggles and its output Q is low. IQ of FF6 is also high, thus the output of N4 switches to high, consequently the coupling switch Q1a is closed by the drivers Q3, Q4. A similar situation happens during the negative half wave of I0. The inverted output IQ of FF5 is set via the reset (R) input by FF1 when D1 is conducting and FF1 triggers on the clock CK. This forces a low on the output of N3, which opens Q1b by the drivers Q5, Q6. This is the initial condition for the controlled coupling of LM during the negative half wave of I0. If the switching threshold of the PWM modulator is reached (the voltage across C5 is equal to the threshold of FF5), FF5 toggles and its inverted output IQ is low. Q of FF6 is also high, thus the output of N3 switches to high, consequently the coupling switch Q1b is closed by the drivers Q5, Q6. The opening of the switches is controlled by Demux2. For this, the zero crossing of the voltage V0 is detected by a zero voltage sensor according to FIG. 8. The blocks V-Sense and Diff with all its components are identical in FIGS. 8 and 11 and are therefore not further explained. The pulses K at the output of N2 signal the moment at which the corresponding switch shall open again. This "turn-off command" triggers FF6 on the Clock input. Consequently the outputs of FF6 become equal to those of FF5. For the positive current half wave of I0 remains N3 on a high output level and. N4 becomes low on its output. For the negative half wave of I0 remains N4 on a high output level and N3 becomes low on its output. Thus from this point (V0 zero crossing) only one of the switches Q1a and Q1b remains continuously closed for the corresponding half-wave of I0. Therefore, the decoupling of LM is only determined by the integrated diodes in Q1a respectively Q1b. A phase advance in the block V-Sense is no longer absolutely necessary. A corresponding signal propagation keeps the switches longer closed which reduces the losses. The important boundary condition that the switch Q1a respectively Q1b must open before the internal diode opens must be strictly adhered.

The advantage of this differentiation (edge detection using flip-flops) is the resilience to transients, which affect only the function disruptively when the total voltage changes its sign. This makes the "turn-off command" of the switches Q1a and Q1b insensitive to network transients. After the circuit start-up, the flip-flop FF6 resynchronizes itself after a maximum time interval of one resonant circuit period. Then, always at least one of the coupling switches Q1a respectively Q1b has been opened and a clock pulse is generated for FF6.

FIG. 11 shows a summary of the demux signal states over a resonant circuit period, the states are shown after the clock (CK) trigger event of the corresponding flip-flops. The output signals of the state diagram correspond to the signals E" respectively F" of FIG. 6.

Another further possible switch control signal generation would be to sense the current in the coupling switches Q1a and Q1b (not shown in FIG. 10). The coupling switch die area is divided into a small sense path. This creates an identical sense MOSFET. The output of this the sense MOSFET is coupled to a comparator which detects the current zero in the switch and its output is further coupled to the input of a Diff block. Alternatively to the sense MOSFET it is also possible to measure the voltage across Rdson with a comparator. One of these options is recommended, especially in an integrated switch control circuit. Such current-sense implementations are already widely used in output stages for example in integrated switching power supplies.

The Demux state diagram of this variant is also shown in FIG. 11. Optimally, both switches can be controlled identically. I0 zero crossing (signal curve B in FIG. 6) defines the opening of both coupling switches. The PWM (voltage across the capacitor C5) controls the closing of both coupling switches, and the current zero instant in the coupling switch controls the opening of both coupling switches. The simplest control circuit is obtained when the switches are controlled by a simple frequency division by means of FF5. In this case the blocks FF6, N3, N4 and the two V-Sense and Diff blocks are eliminated. The output IQ of FF5 is connected directly to the input of driver Q3 and Q4. The output Q of FF5 is directly connected to the input of drivers Q5 and Q6. This variant, however, has the lowest efficiency.

The invention claimed is:

1. An electrical resonant network in which at least one of a resonance frequency, an impedance and an admittance are controlled, said electrical resonance network comprising:
   a) at least one resonant circuit including at least one first inductor and at least one first capacitor;
   b) at least one reactive component;
   c) at least one switch controlled by at least one ON/OFF coupling signal for coupling said reactive component to at least one of said first inductor and said first capacitor, wherein said reactive component is charged and discharged by said resonant circuit and said at least one ON/OFF coupling signal alters its state at least once within a resonant circuit period; and
   d) a control circuit for generating said at least one ON/OFF coupling signal, wherein a first transition change in said at least one ON/OFF coupling signal is responsive to a control signal for controlling the at least one of the resonance frequency, impedance or admittance of said resonant network, and a second transition change in said at least one ON/OFF coupling signal, opposite to said first transition change in said at least one ON/OFF coupling signal is responsive to a state transition in said at least one switch.

2. The electrical resonant network according to claim 1, wherein said at least one ON/OFF coupling signal is a digital signal generated by at least one of a digital gate and flip-flop.

3. The electrical resonant network according to claim 1, wherein said reactive component is at least one second capacitor and said control circuit comprises at least one current- or voltage sensor for detecting at least one of a state and a state change in said at least one switch.

4. The electrical resonant network according to claim 1, wherein said reactive component and at least one of said first inductor and said first capacitor are coupled by at least two switches, each of said at least two switches controlling the coupling at different phase positions within the resonant circuit period.

5. The electrical resonant network according to claim 1, wherein at least one part of said at least one switch is formed by a diode and said at least one ON/OFF coupling signal controls said at least one switch to operatively support at least partly bypassing said diode.

6. The electrical resonant network according to claim 1, wherein said reactive component is at least one second inductor and said control circuit comprises at least one current- or voltage sensor for detecting at least one of a state and a state change in said at least one switch.

7. The electrical resonant network according to claim 6, wherein said at least one switch includes a current sense path for detecting a current through said at least one switch.

8. The electrical resonant network according to claim 1, wherein said control circuit generates said at least one ON/OFF coupling signal responsive to a current- or voltage of said resonant circuit.

9. A method of controlling at least one of a resonance frequency, an impedance and an admittance of a resonant circuit including at least one first inductor and at least one first capacitor, said method comprising;
   coupling at least one reactive component to said resonant circuit based on at least one ON/OFF coupling signal during a coupling interval, the coupling interval changing at least once within a resonant circuit period and said at least one reactive component is charged and discharged by said resonant circuit, and
   generating said at least one ON/OFF coupling signal, wherein a first transition change in said at least one ON/OFF coupling signal is responsive to a control signal for controlling the at least one of the resonance frequency, impedance and admittance of said resonant circuit, and a second transition change in said at least one ON/OFF coupling signal, opposite to said first transition change in said at least one ON/OFF coupling signal, is responsive to a state transition in said at least one switch.

10. The method according to claim 9, wherein said generating includes generating at least one digital ON/OFF coupling signal using at least one of a digital gate and flip-flop.

11. The method according to claim 9, wherein said reactive component is at least one second capacitor and said method further comprising;
 sensing at least one current- or voltage in said at least one switch used in said coupling for detecting at least one of a state and a state change in said at least one switch.

12. The method according to claim 9, wherein at least two switches are used in said coupling of said at least one reactive component to said resonant circuit and each of said at least two switches control the coupling at different phase positions within the resonant circuit period.

13. The method according to claim 9, wherein at least one switch and at least one diode is used in said coupling of said at least one reactive component to said resonant circuit and said ON/OFF coupling signal controls said at least one switch to operatively support at least partly bypassing said at least one diode.

14. The method according to claim 9, wherein said reactive component is at least one second inductor and said method further comprising;
 sensing at least one current- or voltage in said at least one switch used in said coupling for detecting at least one of a state and a state change in said at least one switch.

15. The method according to claim 14, wherein said sensing at least one current- or voltage in said at least one switch includes a comparator for detecting the voltage across a resistance of said at least one switch.

16. The method according to claim 9, wherein said generating said at least one ON/OFF coupling signal is responsive to;
 sensing at least one of a voltage- and/or current of said resonant circuit.

\* \* \* \* \*